(12) United States Patent
Kim et al.

(10) Patent No.: US 9,705,108 B2
(45) Date of Patent: Jul. 11, 2017

(54) DISPLAY PANEL

(71) Applicant: Samsung Display Co., Ltd., Yongin, Gyeonggi-Do (KR)

(72) Inventors: Sungho Kim, Yongin (KR); Jongmoo Huh, Yongin (KR); Sangho Moon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 5 days.

(21) Appl. No.: 14/612,669

(22) Filed: Feb. 3, 2015

(65) Prior Publication Data
US 2016/0087244 A1    Mar. 24, 2016

(30) Foreign Application Priority Data

Sep. 22, 2014    (KR) .................. 10-2014-0126051

(51) Int. Cl.
*H01L 51/52* (2006.01)
*H01L 27/32* (2006.01)

(52) U.S. Cl.
CPC ...... *H01L 51/5271* (2013.01); *H01L 27/3246* (2013.01); *H01L 51/5218* (2013.01); *H01L 51/5221* (2013.01)

(58) Field of Classification Search
CPC ..... H01L 51/52; H01L 27/32; H01L 51/5271; H01L 51/5262; H01L 51/5218; H01L 51/5221; H01L 27/3246; H01L 27/3276

USPC .......................................................... 257/40
See application file for complete search history.

(56) References Cited

U.S. PATENT DOCUMENTS

| | | | |
|---|---|---|---|
| 6,472,817 B1 | 10/2002 | Kawase | |
| 2006/0186801 A1 | 8/2006 | West | |
| 2010/0201609 A1 | 8/2010 | Kim | |
| 2011/0121272 A1 | 5/2011 | Lee et al. | |
| 2011/0169720 A1* | 7/2011 | Hwang | ............... H01L 27/3258 345/76 |

FOREIGN PATENT DOCUMENTS

| | | |
|---|---|---|
| JP | 2003-500799 A | 1/2003 |
| KR | 10-2010-0090448 A | 8/2010 |
| KR | 10-2011-0057598 A | 6/2011 |
| KR | 1020150117359 A | 10/2015 |

* cited by examiner

*Primary Examiner* — Selim Ahmed
(74) *Attorney, Agent, or Firm* — Robert E. Bushnell, Esq.

(57) ABSTRACT

A display panel that includes a plurality of pixels, each pixel includes a first area including a display device; a second area including a first reflective member to reflect light received from the display device to an outside of the display panel for viewing, and a third area including a second reflective member reflecting external light to provide a mirror function when the display device is not displaying an image. The display device includes a pair of reflective electrodes to cause the light produced by the display device to propagate towards the second area. One of the two electrodes may further include a transparent conductive material to provide a waveguide function to the display device in the first area to improve coupling efficiency of the display panel.

20 Claims, 5 Drawing Sheets

DISPLAY PANEL

CLAIM OF PRIORITY

This application claims under 35 U.S.C. §119 the benefit of Korean Patent Application No. 10-2014-0126051, filed on Sep. 22, 2014, in the Korean Intellectual Property Office, the disclosure of which is incorporated herein in its entirety by reference.

BACKGROUND OF THE INVENTION

Field of the Invention

One or more exemplary embodiments relate to a display panel having a display device having an efficient waveguide structure and function, light extracting structure and function and mirror structure and function.

Description of the Related Art

Display apparatuses are currently being replaced by portable thin-type flat display apparatuses. Recently, methods of realizing a mirror function by using external light reflection together with a display function have been proposed.

For the methods of realizing the mirror function, a separate specially coated film capable of reflecting and transmitting light is used for a display panel. In this case, manufacturing costs may increase, and expenses associated with a separate process may increase.

SUMMARY OF THE INVENTION

One or more exemplary embodiments include a display apparatus capable of realizing a display function and a mirror function without using a separate film.

Additional aspects will be set forth in part in the description which follows and, in part, will be apparent from the description, or may be learned by practice of the presented embodiments.

According to one aspect of the present invention, there is provided a display panel including a substrate and a plurality of pixels, each pixel including a first area including a display device having a waveguide function to produce light and to transmit said produced light in a direction parallel to the substrate, a second area including a first reflective member to extract said produced and transmitted light to an outside of the display panel by reflecting said produced and transmitted light emerging from the first area, and a third area including a second reflective member to provide a mirror function by reflecting an external light.

The display device may include a first electrode including a reflective material, a second electrode including a first portion arranged on an upper part of the first electrode within the first area, the second electrode also including a reflective material and an organic emission layer interposed between the first electrode and the second electrode. The display device may also include at least one insulating layer arranged between the first electrode and the substrate within the first area, and being perforated by an opening within the third area, the second electrode may further include a second portion arranged within and at a bottom of the opening and a third portion arranged on sidewalls of the opening surrounding the bottom of the opening, the second reflective member may be the second portion of the second electrode. The second area may be interposed between the first area and the third area. The first reflective member may include the third portion of the second electrode and at least one metal layer interposed between the first electrode and the substrate. The display device may also include a circuit unit arranged within the first area and being interposed between the display device and the substrate. At least one metal layer may be interposed between the first electrode and the substrate being an electrode layer of the circuit unit.

The display panel may also include a pixel-defining layer arranged beneath the second electrode while covering edges of the first electrode, the pixel defining layer being absent from the opening within the third area. The display panel may also include a third reflective member arranged within the first area on at least one side of the display device. The display panel may also include an inorganic layer interposed between the second reflective member and the substrate within the third area at a location corresponding to the opening. The display panel may also include a transparent conductor interposed between the inorganic layer and the second reflective member within the third area at a location corresponding to the opening.

According to another aspect of the present invention, there is provided a display panel, including a substrate, at least one insulating layer arranged on the substrate and having an opening, a display device including a first electrode arranged on the at least one insulating layer and adjacent to the opening, a second electrode arranged both within the opening and on side surfaces of the opening in a region surrounding of the opening, the second electrode facing the first electrode and an organic emission layer interposed between the first electrode and the second electrode. The display panel may also include an emission area interposed between the opening and the display device to extract light from the display panel, wherein the display device being adapted so that light produced by the organic emission layer is transmitted to a side of the display device facing the emission area, and is then extracted from the display panel in a direction of the substrate by being reflected by one or both of the portion of the second electrode arranged on the side surfaces of the opening surrounding the opening in the emission area and at least one metal layer adjacent to the emission area and interposed between first electrode and the substrate. The display panel may also include a circuit unit interposed between the display device and the substrate. The at least one metal layer adjacent to the emission area and interposed between first electrode and the substrate may include the at least one electrode layer of the circuit unit. The display panel may also include a reflective member arranged adjacent to at least one side of the display device than the side thereof adjacent to the emission area. The display panel may also include an inorganic layer interposed between the second electrode and the substrate within the opening. The display panel may also include a transparent conductor interposed between the inorganic layer and the second electrode within the opening. The first electrode and the second electrode each may include a reflective material. The display panel may also include a pixel-defining layer arranged under the second electrode and covering an edge of the first electrode, the pixel-defining layer being absent from the opening.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
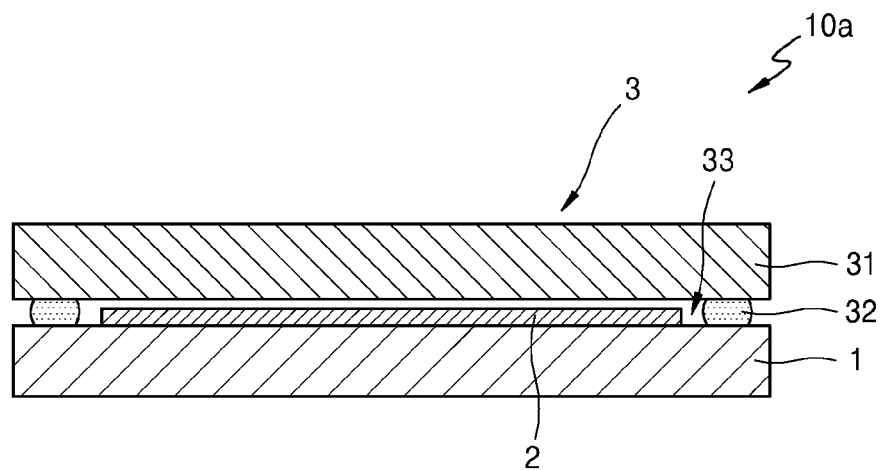
FIGS. 1 and 2 are cross-sectional views of display panels according to a first embodiment of the present invention.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Hereinafter, exemplary embodiments will be described in detail with reference to the accompanying drawings, and like reference numerals in the drawings denote like elements, and thus their repetitive description will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

Figure 2:
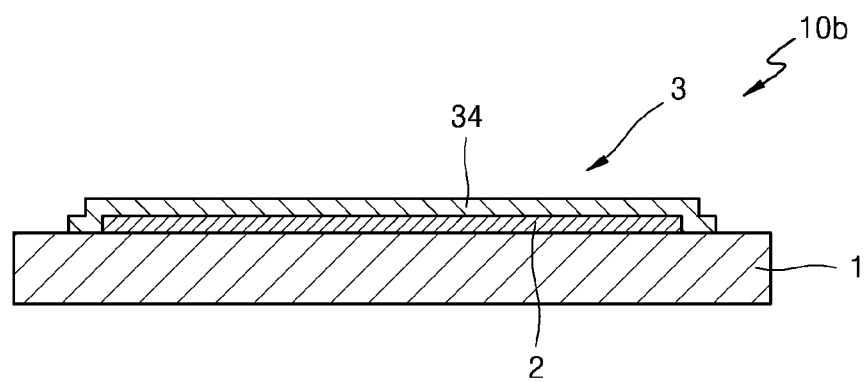

FIGS. 1 and 2 are cross-sectional views of display panels 10a and 10b according to embodiments of the present invention. Referring to FIG. 1, the display panel 10a according to an embodiment of the present invention includes a light-emitting unit 2 formed on one surface of a substrate 1, and an encapsulation part 3 encapsulating the light-emitting unit 2. The substrate 1 may be made out of glass or plastic, and may be transparent. The encapsulation part 3 may be an encapsulation substrate 31 made out of a transparent glass or plastic substrate so that an image from the light-emitting unit 2 can be realized, and prevents infiltration of external air and humidity into the light-emitting unit 2. Both the substrate 1 and the encapsulation substrate 31 may be flexible.

A space 33 between the substrate 1 and the encapsulation substrate 31 is encapsulated by bonding edges of the substrate 1 and the encapsulation substrate 31 by an encapsulation member 32. A hygroscopic material, a filler, or the like may be located within the space 33.

Instead of the encapsulation substrate 31, the encapsulation part 3 may be a thin encapsulation film 34 as in the display panel 10b of FIG. 2. The light-emitting unit 2 may be protected from external air by forming the encapsulation film 34 on the light-emitting unit 2. The encapsulation film 34 may have a structure in which a layer made out of an inorganic material such as silicon oxide or silicon nitride, and a layer made out of an organic material such as epoxy or polyimide, are alternately stacked, however the present invention is not necessarily limited thereto, as any transparent thin-film encapsulation structure may be applied thereto.

Figure 3:
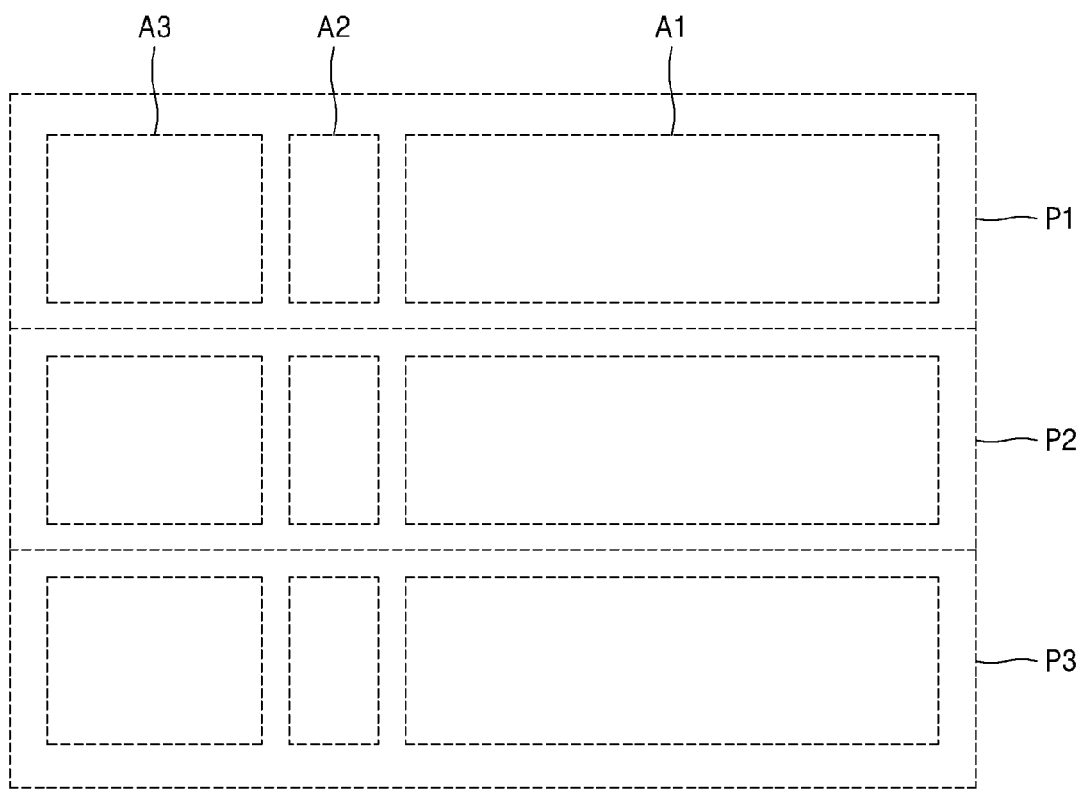
FIG. 3 is a top view of pixels formed in a display panel, according to embodiments of the present invention.
Figure 4:
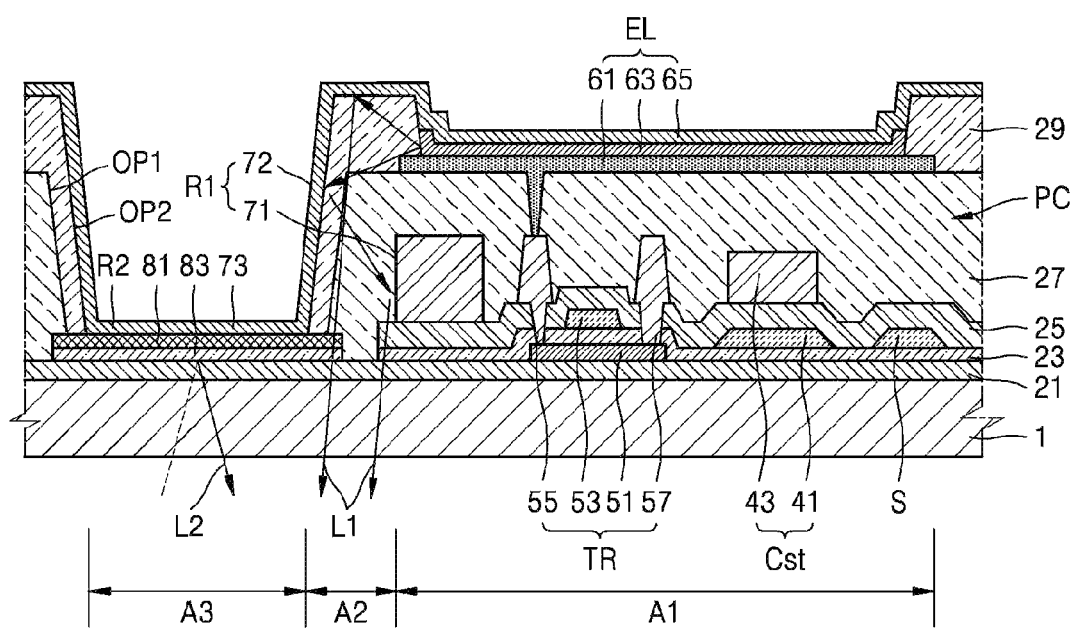
FIG. 4 is a cross-sectional view of one of the pixels of FIG. 3.

Turning now to FIGS. 3 and 4, FIG. 3 is a top view of pixels P1, P2, and P3 formed in a display panel, according to an embodiment of the present invention, and FIG. 4 is a cross-sectional view of one of the pixels P1, P2, and P3 of FIG. 3.

The pixels P1, P2, and P3 are arranged on the substrate 1, and each of the pixels P1, P2, and P3 may include a first area A1, a second area A2 adjacent to one side of the first area A1, and a third area A3 adjacent to one side of the second area A2. Each of the pixels P1, P2, and P3 may be one of, for example, a red pixel, a green pixel, and a blue pixel, and a white pixel.

Within the first area A1 is a device area in which a display device EL and a pixel circuit electrically connected to the display device EL are provided. Although the display device EL is provided within the first area A1, light produced by the display device EL is not emitted from the display from first area A1 since the produced light travels sideways along the display device EL to an edge of the display device EL.

The display device EL may be an organic light-emitting diode (OLED) including a first electrode 61, a second electrode 65 facing the first electrode 61, and an organic layer 63 interposed between the first electrode 61 and the second electrode 65. Each of the first electrode 61 and the second electrode 65 include a reflective material. The organic layer 63 may be formed by stacking an organic emission layer and at least one selected from the group consisting of functional layers such as a hole transport layer (HTL), a hole injection layer (HIL), an electron transport layer (ETL), an electron injection layer (EIL), and the like, in a single or composite structure.

The first electrode 61 may have a stack structure including a transparent conductor and a reflective layer. The transparent conductor may include indium tin oxide (ITO), indium zinc oxide (IZO), zinc oxide (ZnO), indium oxide ($In_2O_3$), or the like having a high work function. The reflective layer may include at least one metal selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), and an alloy thereof. For example, the first electrode 61 may have a stack structure of ITO/Ag/ITO. The second electrode 65 may be a reflective electrode including at least one metal selected from the group consisting of Ag, Mg, Al, Pt, Pd, Au, Ni, Nd, Ir, Cr, Li, Ca, Mo, and an alloy thereof.

Figure 5:
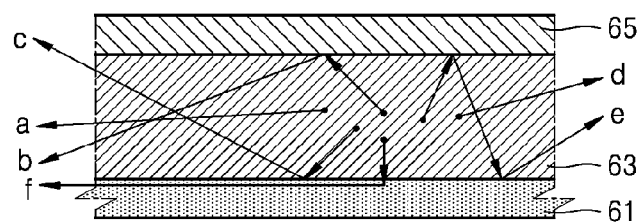
FIG. 5 is a cross-sectional view for describing paths of light produced by a display device according to embodiments of the present invention.

As shown in FIG. 5, a portion of light emitted by the organic layer 63 of the display device EL may be waveguided (refer to f) along a waveguide mode between the transparent conductor, e.g., ITO, of the first electrode 61 and the organic layer 63, and be emitted from a side surface of the display device EL. The other portion of the light emitted by the organic layer 63 of the display device EL may be reflected (refer to c) by the reflective layer of the first electrode 61, reflected (refer to b) by the second electrode 65 which is also a reflective electrode, reflected (refer to e) by both the first electrode 61 and the second electrode 65 and thereafter emitted from side surfaces of the display device EL, or may be directly emitted (refer to a and d) from the side surfaces of the display device EL.

According to the present embodiment, by forming the first electrode 61 of the display device EL with a reflective layer and a transparent conductor, and forming the second electrode 65 with a reflective electrode, paths of light are guided to the side surfaces of display device EL by using the waveguide mode of the OLED. Light emitted in a direction of the second area A2 among the light emitted to the side surfaces of the display device EL is reflected by at least one first reflective member R1 disposed in or near the second area A2, to change a path thereof, thereby being extracted from the display panel in a direction of the substrate 1. Light emitted in a direction other than the second area A2 among the light emitted to the side surfaces of the display device EL is waveguided by an insulating layer or caught, thereby hardly influencing light-emission.

According to another embodiment, the first electrode 61 may be made out of a reflective electrode as well as the second electrode 65. In this case, the display device EL may guide paths of light emitted by the organic layer 63 of the display device EL to the side surfaces by reflecting the light by the first electrode 61 and the second electrode 65 without a waveguide mode.

A pixel circuit PC may include at least one thin-film transistor TR and a capacitor Cst. FIG. 4 shows a scan line S among at least one wiring connected to the thin-film transistor TR and the capacitor Cst. The thin-film transistor TR includes an active layer 51, a gate electrode 53, a source electrode 55, and a drain electrode 57. The capacitor Cst includes a lower electrode 41 and an upper electrode 43. Although FIG. 4 shows one thin-film transistor TR and one capacitor Cst arranged as the pixel circuit PC, the present invention is not limited thereto, as a plurality of thin-film transistors and capacitors may be further included, and wirings, such as a scan line, a data line, a power line, and the like, connected to the plurality of thin-film transistors and capacitors may be further included. The pixel circuit PC is disposed under the display device EL and is overlapped by the display device EL. The thin-film transistor TR of the pixel circuit PC is electrically connected to the display device EL.

In the first area A1, a light-reflective metal layer 71 including a reflective material may be further included near a boundary between the first area A1 and the second area A2. The light-reflective metal layer 71 is a portion of the first reflective member R1 and changes paths of incident light by reflecting the light, thereby extracting the light from the display in the direction of the substrate 1. The second area A2 is an emission area through which light received from an adjoining side of the display device EL is extracted from the display panel in the direction of the substrate 1, to thereby realize an image recognized by a user. The extended part 72 extending from the second electrode 65 and covering a side surface of the second opening OP2 and surroundings of the second opening OP2 may function as the first reflective member R1.

As shown in FIG. 5, light emitted in a direction of the second area A2, among the light emitted from the adjoining side of the display device EL in first area A1, is reflected by the first reflective member R1, and the reflected light L1 is extracted from the display device in the direction of the substrate 1 from the second area A2, thereby displaying an image. The first reflective member R1 may include the light-reflective metal layer 71 in the first area A1 and an extended part 72 of the second electrode 65 of the display device EL, which extends to a second opening OP2 in the third area A3.

Although the light-reflective metal layer 71 is included in the first reflective member R1 according to the embodiment of FIG. 4, the present embodiment is not limited thereto, and without separately providing the light-reflective metal layer 71, a plurality of circuit devices forming the pixel circuit PC may instead be properly arranged such that the light-reflective metal layer 71 is replaced by at least one electrode of the circuit devices. For example, the source electrode 55 or the drain electrode 57 of the thin-film transistor TR, the upper electrode 43 of the capacitor Cst, and the like may be disposed near the boundary between the first area A1 and the second area A2 to function as the first reflective member R1.

The third area A3 is a mirror area in which a second reflective member R2 is provided, and a mirror function is realized by reflecting light incident from the outside of the display device by the second reflective member R2 while the display device EL is not emitting light.

According to the embodiments of the present invention, an image may be displayed by producing light by the display device EL in the first area A1, transmitting said produced light to the second area A2, and extracting the transmitted light from the display from the second area A2. Also, a separate mirror function may be realized by reflecting light incident from the outside by the second reflective member R2 in the third area A3 when the display device EL is not emitting light.

In the third area A3, a first opening OP1 and the second opening OP2 are formed, and the second reflective member R2 is a portion of the second electrode 65 arranged at the bottom of the second opening OP2. The second reflective member R2 may be an extended part 73 of the second electrode 65, and is arranged at the bottom of the second opening OP2 by extending the second electrode 65 of the display device EL to the second opening OP2 within the third area A3. The second reflective member R2 may perform the mirror function of reflecting external light incident from the outside and allowing a user to view a mirror surface by using the reflected external light L2 when no image is being displayed.

In the first embodiment, a conductor 81 and an inorganic layer 83 may be disposed between the extended part 73 of the second reflective member R2 and the substrate 1. The conductor 81 may be a transparent conductor including ITO, IZO, ZnO, $In_2O_3$, or the like, and may increase adhesion between surrounding insulating layers. According to circumstances, the conductor 81 and/or the inorganic layer 83 may be omitted to improve a reflexibility of external light as will be described later in conjunction with the second and third embodiments of FIGS. 6 and 7 respectively.

A structure of a pixel will now be described in more detail with reference to FIG. 4. First, the buffer layer 21 is formed on the substrate 1. The buffer layer 21 may be provided to prevent the spread of impurity ions, to prevent the infiltration of humidity and external air, and to planarize a surface of the substrate 1. The buffer layer 21 is not a mandatory component and may not be provided according to circumstances.

The active layer 51 of the thin-film transistor TR is formed on the buffer layer 21 within the first area A1. The active layer 51 may be made out of an inorganic semiconductor such as amorphous silicon or crystalline silicon (polysilicon), an oxide semiconductor, or an organic semiconductor. The active layer 51 includes source and drain regions doped with impurities and a channel region arranged therebetween.

The first insulating layer 23 is formed on the substrate 1 on which the active layer 51 is formed, and the gate electrode 53 of the thin-film transistor TR, the lower electrode 41 of the capacitor Cst, and the scan line S are formed on the first insulating layer 23. The first insulating layer 23 functions as a gate insulating layer for the thin film transistor TR by being interposed between the active layer 51 and the gate electrode 53, and functions as a dielectric layer of the capacitor Cst by being interposed between the lower electrode 41 and the upper electrode 43 of the capacitor Cst. The first insulating layer 23 may be made out of an inorganic insulating material such as $SiN_x$, $SiO_x$, or the like.

The gate electrode 53 of the thin-film transistor TR, the lower electrode 41 of the capacitor Cst, and the scan line S may be formed by forming a first conductive layer on the first insulating layer 23, and patterning the first conductive layer within the first area A1. The gate electrode 53 may be electrically connected to the scan line S. The first conductive layer may be made out of at least one metal selected from the group consisting of Al, Pt, Pd, Ag, Mg, Au, Ni, Nd, Ir, Cr, Li, Ca, Mo, titanium (Ti), tungsten (W), and copper (Cu), and can be a single layer or a plurality of layers.

The second insulating layer 25 is formed on the gate electrode 53 of the thin-film transistor TR, the lower electrode 41 of the capacitor Cst, and the scan line S. The second insulating layer 25 functions as an interlayer insulating layer between the gate electrode 53 and the source electrode 55/drain electrode 57 of the thin-film transistor TR. The second insulating layer 25 may be made out of at least one organic insulating material selected from the group consisting of polyimide, polyamide, acrylic resin, benzocyclobutene, and phenol resin. In addition, the second insulating layer 25 may also include an inorganic insulating material as with the first insulating layer 23, or may be formed by alternately stacking an organic insulating material and an inorganic insulating material.

In the first area A1, contact holes through which the source and drain regions of the active layer 51 are respectively exposed are formed in the first insulating layer 23 and the second insulating layer 25. In the second area A2, the first insulating layer 23 and the second insulating layer 25 are removed. In the third area A3, the second insulating layer 25 is removed, and the inorganic layer 83 is formed by patterning the first insulating layer 23.

The source electrode 55 and the drain electrode 57 of the thin-film transistor TR and the upper electrode 43 of the capacitor Cst are formed on the second insulating layer 25 in the first area A1. The source electrode 55 and the drain electrode 57 respectively contact the source region and the drain region of the active layer 51.

The source electrode 55 and the drain electrode 57 of the thin-film transistor TR and the upper electrode 43 of the capacitor Cst may be formed by forming a second conductive layer on the second insulating layer 25 and patterning the second conductive layer. The second conductive layer may be made out of at least one metal selected from the group consisting of Al, Pt, Pd, Ag, Mg, Au, Ni, Nd, Ir, Cr, Li, Ca, Mo, Ti, W, and Cu, and be either a single layer or a plurality of layers. The light-reflective metal layer 71 may be further formed by patterning the second conductive layer near the boundary between the first area A1 and the second area A2.

The first conductive layer and the second conductive layer may include a reflective material. Accordingly, the gate electrode 53, the source electrode 55, and the drain electrode 57 of the thin-film transistor TR, the lower electrode 41 of the capacitor Cst, the scan line S, and the light-reflective metal layer 71 may also perform the mirror function of reflecting external light incident from the outside and allowing a user to view a mirror surface by the reflected external light when no image is displayed.

Next, the conductor 81 is formed on the inorganic layer 83 in the third area A3. The conductor 81 may be a transparent conductor including ITO, IZO, ZnO, $In_2O_3$, or the like. The conductor 81 may be formed by forming a third conductive layer on the substrate 1 on which the source electrode 55 and the drain electrode 57 of the thin-film transistor TR and the upper electrode 43 of the capacitor Cst are formed and patterning the third conductive layer. The third conductive layer is entirely removed except for the third area A3. According to another embodiment, the third conductive layer may be patterned in the first area A1 and contact the source electrode 55 and the drain electrode 57 of the thin-film transistor TR and the upper electrode 43 of the capacitor Cst.

Next, a passivation layer 27, which is one type of an insulating layer, is formed on the substrate 1 on which the pixel circuit PC and the conductor 81 are formed. In the third area A3, the passivation layer 27 is removed to expose a portion of the conductor 81, thereby forming the first opening OP1 in the passivation layer 27. The first opening OP1 is formed maintaining a predetermined distance from the first area A1 to secure the second area A2. The passivation layer 27 may be made out of an organic insulating material, an inorganic insulating material or may be formed by alternately stacking an organic insulating material and an inorganic insulating material, as described above.

Next, the first electrode 61, which is a pixel electrode of the display device EL that electrically connected to the thin-film transistor TR, is formed on the passivation layer 27 in the first area A1. The first electrode 61 is disposed to overlap and cover the pixel circuit PC. The first electrode 61 is an electrode layer including a material having a good reflection characteristic. For example, the first electrode 61 may be formed in a stack structure of a transparent conductor and a reflective layer. The transparent conductor may be made out of ITO, IZO, ZnO, $In_2O_3$, or the like having a high work function. The reflective layer may include at least one metal selected from the group consisting of Ag, Mg, Al, Pt, Pd, Au, Ni, Nd, Ir, Cr, Li, Ca, Mo, and an alloy thereof. Alternatively, the first electrode 61 may has a single-layer structure of the reflective layer.

A pixel-defining layer 29 is formed on the substrate 1 on which the first electrode 61 is formed, such that the pixel-defining layer 29 covers the first electrode 61 and the first opening OP1. The pixel-defining layer 29 is removed from the first area A1 to cover only outer portions (the edges) of the first electrode 61 while exposing a center portion thereof. In addition, the pixel-defining layer 29 is removed from the third area A3 to expose a portion of the conductor 81, thereby forming the second opening OP2 in the pixel-defining layer 29. The pixel-defining layer 29 may be made out of an organic insulating material and/or an inorganic insulating material.

The organic layer 63 and the second electrode 65 are sequentially formed on the first electrode 61. The organic layer 63 may be formed by stacking an organic emission layer and at least one functional layer selected from the group consisting of HTL, an HIL, an ETL, an EIL, and the like, in a single or composite structure. The functional layers may be common layers formed on the whole surface of the substrate 1.

The organic emission layer is a patterned layer formed on the first electrode 61. The organic emission layer may be made out of a low or high-molecular organic material. When the organic emission layer emits red, green, or blue light, the organic emission layer may be patterned as a red emission layer, a green emission layer, or a blue emission layer. When the organic emission layer emits white light, the organic emission layer may have a multi-layer structure in which a red emission layer, a green emission layer, and a blue emission layer are stacked so as to emit white light, or may instead have a single-layer structure including a red emission material, a green emission material, and a blue emission material.

The second electrode 65 may include at least one metal selected from the group consisting of Ag, Mg, Al, Pt, Pd, Au, Ni, Nd, Ir, Cr, Li, Ca, Mo, and an alloy thereof. The second electrode 65 is formed on the whole surface of the substrate 1 and covers the first area A1, the second area A2, and the third area A3. That is, the second electrode 65 extends to the bottom, the side surfaces and the surroundings of the second opening OP2. Accordingly, the extended part 72 of the second electrode 65, which is formed on the side surface surrounding the second opening OP2, functions as the first reflective member R1 for changing paths of light laterally received from the display device EL to a thickness direction of the display panel in the direction of the substrate 1. The extended part 73 of the second electrode 65, which is formed at the bottom of the second opening OP2, functions as the second reflective member R2 for the mirror function.

The extended part 72 of the second electrode 65 may also perform the mirror function of reflecting external light incident from the outside and allowing a user to view a mirror surface by the reflection of external light when no image is being displayed.

Figure 6:
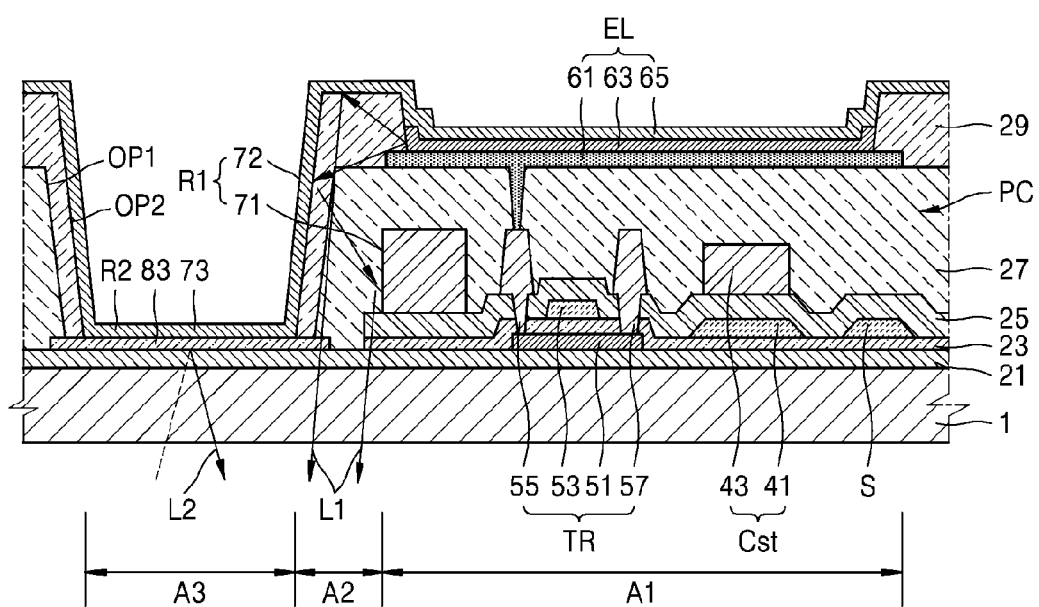
FIGS. 6 and 7 are cross-sectional views of respective portions of display panels according to second and third embodiments respectively of the present invention.
Figure 7:
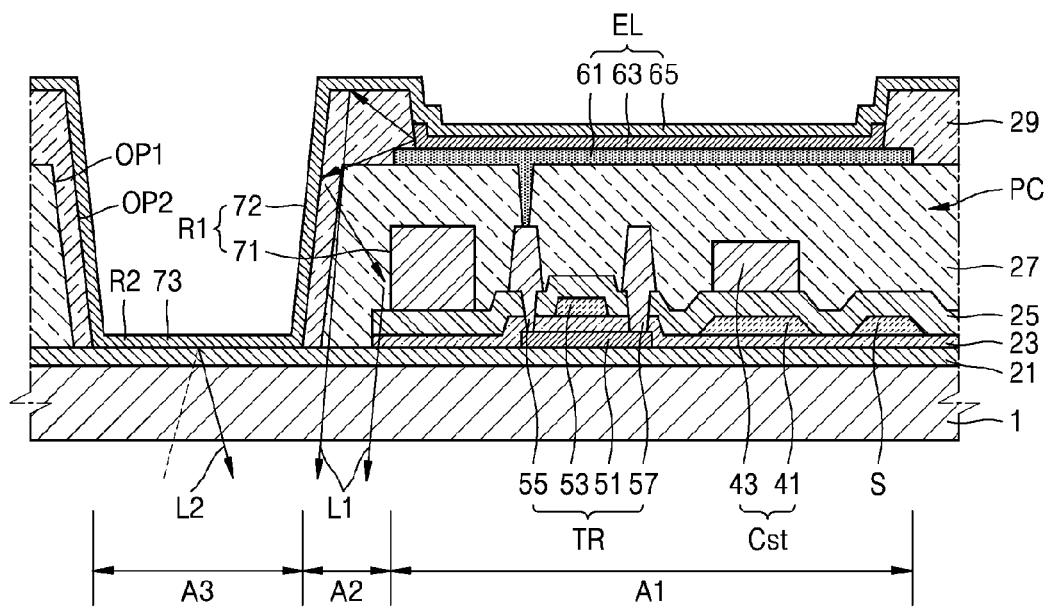

Turning now to FIGS. 6 and 7, FIGS. 6 and 7 are cross-sectional views of a portion of display panels according to second and third embodiments of the present invention. The display panel according to the second embodiment of FIG. 6 differs from the display panel of FIG. 4 only in that the only the inorganic layer 83, and not the conductor 81, is disposed between the second reflective member R2 of extended part 73 and the substrate, at a location corresponding to the second opening OP2 within the third area A3, and is the same as the display panel of FIG. 4 for the other components.

According to the embodiment of FIG. 6, a process of forming the conductor 81 is omitted, and thus the second reflective member R2 directly contacts the inorganic layer 83. As a result, the reflection efficiency of the third area A3 may increase since the conductor 81 is omitted.

The plurality of pixels P1, P2, and P3 are arranged on the substrate 1, and each of the pixels P1, P2, and P3 may include the first area A1, the second area A2 adjacent to one side of the first area A1, and the third area A3 adjacent spaced apart from the first area A1 by the second area A2. The buffer layer 21 is formed on the substrate 1, and the active layer 51 of the thin-film transistor TR is formed on the buffer layer 21 within the first area A1. The first insulating layer 23 is formed on the substrate 1 on which the active layer 51 is formed, and the gate electrode 53 of the thin-film transistor TR, the lower electrode 41 of the capacitor Cst, and the scan line S are formed on the first insulating layer 23. The second insulating layer 25 is then formed on the gate electrode 53 of the thin-film transistor TR, the lower electrode 41 of the capacitor Cst, and the scan line S.

In the first area A1, contact holes through which the source and drain regions of the active layer 51 are respectively exposed are formed in the first insulating layer 23 and the second insulating layer 25. In the second area A2, the first insulating layer 23 and the second insulating layer 25 are removed. In the third area A3, the second insulating layer 25 is removed, and the inorganic layer 83 is formed by patterning the first insulating layer 23.

The passivation layer 27 is formed on the substrate 1 on which the pixel circuit PC and the inorganic layer 83 are formed. In the third area A3, the passivation layer 27 is removed to expose a portion of the inorganic layer 83, thereby forming the first opening OP1 in the passivation layer 27.

The first electrode 61 of the display device EL is formed on the passivation layer 27 in the first area A1, such that the first electrode 61 overlaps the pixel circuit PC. The pixel-defining layer 29 is formed on the substrate 1 on which the first electrode 61 is formed, such that the pixel-defining layer 29 covers the first electrode 61 and the first opening OP1. The pixel-defining layer 29 is removed from the first area A1 so that it covers only outer portions (the edges) of the first electrode 61 while exposing a central portion thereof. In addition, the pixel-defining layer 29 is removed from the third area A3 to expose a portion of the inorganic layer 83, thereby forming the second opening OP2 in the pixel-defining layer 29. The organic layer 63 and the second electrode 65 are then sequentially formed on the first electrode 61.

The display panel according to the third embodiment of FIG. 7 differs from the display panel of FIG. 4 in that the conductor 81 and the inorganic layer 83 are not present between extended part 73 of the second reflective member R2 and the substrate 1 at a location corresponding to the second opening OP2 of the third area A3, while being the same as the display panel of FIG. 4 for the other components.

According to the embodiment of FIG. 7, a process of forming the conductor 81 and the inorganic layer 83 are omitted, and thus the second reflective member R2 directly contacts the buffer layer 21. The reflection efficiency of the third area A3 therefore may further increase since the conductor 81 and the inorganic layer 83 are omitted.

The plurality of pixels P1, P2, and P3 are arranged on the substrate 1, and each of the pixels P1, P2, and P3 may include the first area A1, the second area A2 adjacent to one side of the first area A1, and the third area A3 adjacent to one side of the second area A2. The buffer layer 21 is formed on the substrate 1, and the active layer 51 of the thin-film transistor TR is then formed on the buffer layer 21 within the first area A1. The first insulating layer 23 is formed on the substrate 1 on which the active layer 51 is formed, and the gate electrode 53 of the thin-film transistor TR, the lower electrode 41 of the capacitor Cst, and the scan line S are formed on the first insulating layer 23. The second insulating layer 25 is then formed on the gate electrode 53 of the thin-film transistor TR, the lower electrode 41 of the capacitor Cst, and the scan line S.

In the first area A1, contact holes, through which the source and drain regions of the active layer 51 are respectively exposed, are formed in the first insulating layer 23 and the second insulating layer 25. In the second area A2 and the third area A3, the first insulating layer 23 and the second insulating layer 25 are removed. The passivation layer 27 is formed on the substrate 1 on which the pixel circuit PC is formed. In the third area A3, the passivation layer 27 is removed to expose a portion of the buffer layer 21, thereby forming the first opening OP1 in the passivation layer 27. The first electrode 61 of the display device EL is formed on the passivation layer 27 in the first area A1, such that the first electrode 61 overlaps the pixel circuit PC.

The pixel-defining layer 29 is formed on the substrate 1 on which the first electrode 61 is formed, such that the pixel-defining layer 29 covers the first electrode 61 and the first opening OP1. The pixel-defining layer 29 is then removed from the first area A1 so that it covers only an outer portion (the edge) of the first electrode 61 while exposes a center portion thereof. In addition, the pixel-defining layer 29 is removed from the third area A3 to expose a portion of the buffer layer 21, thereby forming the second opening OP2 in the pixel-defining layer 29. The organic layer 63 and the second electrode 65 are then sequentially formed on the first electrode 61.

Figure 8:
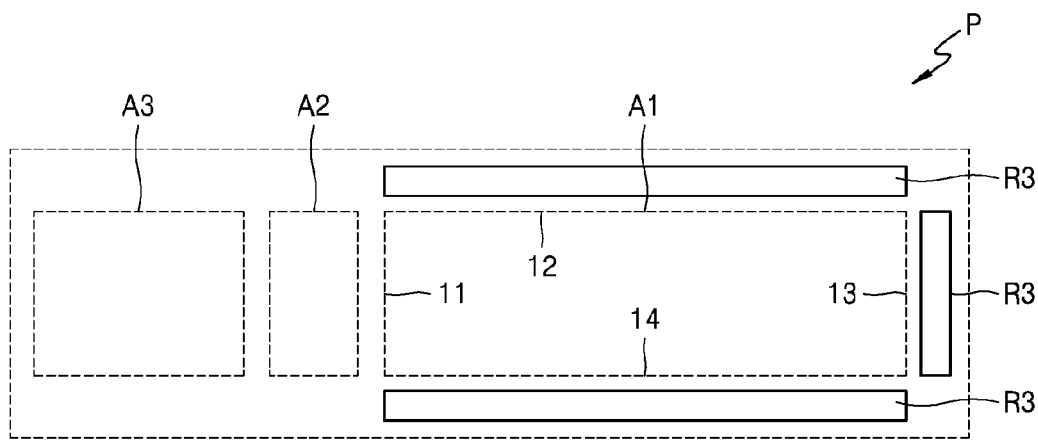
FIG. 8 is a top view of a portion of a display panel according to a fourth embodiment of the present invention.

Turning now to FIG. 8, FIG. 8 is a top view of a portion of a display panel according to a fourth embodiment of the present invention. Compared with the embodiments of FIGS. 3 to 7, the display panel according to the fourth embodiment of FIG. 8 differs from the display panels of FIGS. 3 to 7 in that a third reflective member R3 in the first area A1 is further included, and is otherwise the same as the display panels of FIGS. 3 to 7, and thus repetitive descriptions are omitted.

A pixel P on a substrate may include the first area A1, the second area A2 adjacent to one side of the first area A1, and the third area A3 on an opposite side of the second area A2 than the first area A1. The pixel P may be, for example, any one of a red pixel, a green pixel, a blue pixel, and a white pixel.

As shown in FIG. 5, a portion of light emitted by the organic layer 63 of the display device EL may be waveguided (refer to f) along the waveguide mode between the transparent conductor of the first electrode 61 and the organic layer 63, and be emitted from a side surface of the display device EL facing second area A2, and the other portion of the light may be reflected (refer to b, c, and e) by the first electrode 61 and/or the second electrode 65, and thereafter emitted from side surfaces of the display device EL, or may be directly emitted (refer to a and d) from the side surfaces of the display device EL.

According to the fourth embodiment, the third reflective member R3 may be additionally provided on a passivation layer 27 at second to fourth sides 12, 13, and 14 of area A1, but may not be present at the first side 11 of area A1 adjacent to the second area A2. Light emitted from the display device EL to the second to fourth sides 12, 13, and 14 may therefore be reflected by the third reflective member R3, and a portion of the reflected light may be emitted via the first side 11. Therefore, according to the fourth embodiment, a loss of light emitted in the directions other than the first side 11 adjacent to the second area A2 of the display device EL may be prevented, thereby increasing the light-extraction efficiency towards the second area A2.

As described above, according to the one or more of the above exemplary embodiments, a display panel capable of realizing a display function and a mirror function in a bottom emission-type display apparatus may be provided.

According to the principles of the present invention, there is provided a display panel that includes a plurality of pixels, each pixel includes a first area including a display device; a second area including a first reflective member to reflect the light produced and received from the display device of the first area to an outside of the display panel for viewing, and a third area including a second reflective member to reflect external light to provide a mirror function for the display panel when the display device is not displaying an image. The display device includes a pair of reflective electrodes on opposite sides of an emission layer to cause the light produced by the display device to propagate sideways towards the second area. One of the two electrodes may further include a transparent conductive material to provide a waveguide function to the display device in the first area to improve efficiency of the display panel. The result being an efficient display panel that also doubles as a mirror.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display panel including a substrate and a plurality of pixels, each pixel comprising:
    a first area including a display device having a waveguide function to produce light and to transmit said produced light in a direction parallel to the substrate;
    a second area including a first reflective member to extract said produced and transmitted light to an outside of the display panel by reflecting said produced and transmitted light emerging from the first area; and
    a third area including a second reflective member to provide a mirror function by reflecting external light.

2. The display panel of claim 1, wherein the display device comprises:
    a first electrode including a reflective material;
    a second electrode including a first portion arranged on an upper part of the first electrode within the first area, the second electrode also including a reflective material; and
    an organic emission layer interposed between the first electrode and the second electrode.

3. The display panel of claim 2, further comprising at least one insulating layer arranged between the first electrode and the substrate within the first area, and being perforated by an opening within the third area, wherein the second electrode further includes a second portion arranged within and at a bottom of the opening and a third portion arranged on sidewalls of the opening surrounding the bottom of the opening, the second reflective member being the second portion of the second electrode.

4. The display panel of claim 3, wherein the second area is interposed between the first area and the third area.

5. The display panel of claim 3, wherein the first reflective member comprises:
    the third portion of the second electrode; and
    at least one metal layer interposed between the first electrode and the substrate.

6. The display panel of claim 5, further comprising a circuit unit arranged within the first area and being interposed between the display device and the substrate.

7. The display panel of claim 6, wherein the at least one metal layer interposed between the first electrode and the substrate being an electrode layer of the circuit unit.

8. The display panel of claim 3, further comprising a pixel-defining layer arranged beneath the second electrode while covering edges of the first electrode, the pixel defining layer being absent from the opening within the third area.

9. The display panel of claim 1, further comprising a third reflective member arranged within the first area on at least one side of the display device.

10. The display panel of claim 1, further comprising an inorganic layer interposed between the second reflective member and the substrate within the third area at a location corresponding to the opening.

11. The display panel of claim 10, further comprising a transparent conductor interposed between the inorganic layer and the second reflective member within the third area at a location corresponding to the opening.

12. A display panel, comprising:
a substrate;
at least one insulating layer arranged on the substrate and having an opening; and
a display device including:
a first electrode arranged on the at least one insulating layer and adjacent to the opening;
a second electrode covering the opening and facing the first electrode, the second electrode being a reflective member;
an organic emission layer interposed between the first electrode and the second electrode; and
an emission area interposed between the opening and the display device to extract light from the display panel.

13. The display panel of claim 12, wherein the display device being adapted so that light produced by the organic emission layer is transmitted to a side of the display device facing the emission area, and is then extracted from the display panel in a direction of the substrate by being reflected by one or both of the portion of the second electrode arranged on side surfaces of the opening surrounding the opening in the emission area and at least one metal layer adjacent to the emission area and interposed between first electrode and the substrate.

14. The display panel of claim 12, further comprising a reflective member arranged adjacent to at least one side of the display device other than the side thereof adjacent to the emission area.

15. The display panel of claim 12, further comprising an inorganic layer interposed between the second electrode and the substrate within the opening.

16. The display panel of claim 15, further comprising a transparent conductor interposed between the inorganic layer and the second electrode within the opening.

17. The display panel of claim 12, wherein the first electrode comprises a reflective material.

18. The display device of claim 12, wherein light produced by the display device is not emitted from the display panel at a location corresponding to the display device but is instead extracted from the display panel at a location corresponding to the space between the display device and the opening.

19. A display panel, comprising:
a substrate;
at least one insulating layer arranged on the substrate and having an opening; and
a display device spaced apart from the opening by an emitting portion, the display device including:
a first electrode arranged on the at least one insulating layer and adjacent to the opening;
a second electrode facing the first electrode; and
an organic emission layer interposed between the first electrode and the second electrode, wherein light produce by the display device is not emitted from the display panel at a location corresponding to the display device but is instead extracted from the display panel at a location corresponding to the emitting portion between the display device and the opening.

20. The display device of claim 19, the second electrode also being arranged both within the opening and on side surfaces of the opening at a region surrounding of the opening, the second electrode on portions of the side surfaces of the opening being a reflective member that serves to reflect and extract light produced by the display device and propagating sideways from the display device to an outside of the display panel for viewing.

* * * * *